United States Patent
Miller et al.

(10) Patent No.: US 10,598,731 B2
(45) Date of Patent: Mar. 24, 2020

(54) CIRCUIT INTERRUPTER AND SYSTEM FOR TESTING THE SAME

(71) Applicant: EATON CORPORATION, Cleveland, OH (US)

(72) Inventors: Theodore J. Miller, Oakdale, PA (US); Lothar Jagusch, Bonn (DE)

(73) Assignee: EATON INTELLIGENT POWER LIMITED, Dublin (IE)

( * ) Notice: Subject to any disclaimer, the term of this patent is extended or adjusted under 35 U.S.C. 154(b) by 318 days.

(21) Appl. No.: 15/519,936

(22) PCT Filed: Nov. 10, 2014

(86) PCT No.: PCT/US2014/064784
§ 371 (c)(1),
(2) Date: Apr. 18, 2017

(87) PCT Pub. No.: WO2016/076823
PCT Pub. Date: May 19, 2016

(65) Prior Publication Data
US 2017/0322258 A1    Nov. 9, 2017

(51) Int. Cl.
*G01R 31/327* (2006.01)
*G01R 31/28* (2006.01)
(Continued)

(52) U.S. Cl.
CPC ....... *G01R 31/327* (2013.01); *G01R 31/2827* (2013.01); *G06F 1/022* (2013.01);
(Continued)

(58) Field of Classification Search
CPC .............. G01R 31/327; G01R 31/2827; H01H 1/0007; H01H 33/7007; H01H 2071/004; H02H 1/063; H02H 1/0007; G06F 1/022
(Continued)

(56) References Cited

U.S. PATENT DOCUMENTS

| 5,742,513 A | 4/1998 | Bouhenguel et al. |
| 8,970,224 B2 | 3/2015 | Fischer |
| 2003/0132753 A1* | 7/2003 | Lavoie ............... G01R 31/3277 324/424 |

FOREIGN PATENT DOCUMENTS

| EP | 1 939 642 A2 | 7/2008 |
| WO | 2013/175846 A1 | 11/2013 |

OTHER PUBLICATIONS

EP 1-939-642. Relay Device and corresponding method; Publication Date: Jul. 2, 2008; Abstract; specification; Figures (Year: 2008).*

(Continued)

*Primary Examiner* — Dharti H Patel
(74) *Attorney, Agent, or Firm* — Eckert Seamans Cherin & Mellott, LLC

(57) ABSTRACT

A circuit interrupter includes a sensor structured to output a sensor signal, a control unit structured to receive an external control signal, the control unit including: a communication interface structured to receive the external control signal, and a waveform generator structured to generate a waveform equivalent to the sensor signal in response to the external control, and a signal processing circuit structured to receive and process the sensor signal or the generated waveform and to output the processed sensor signal or generated waveform to the control unit.

14 Claims, 4 Drawing Sheets

(51) Int. Cl.
   *G06F 1/02*      (2006.01)
   *H01H 33/70*     (2006.01)
   *H02H 1/00*      (2006.01)
   *H01H 71/00*     (2006.01)
   *H02H 1/06*      (2006.01)

(52) U.S. Cl.
   CPC ...... *H01H 33/7007* (2013.01); *H02H 1/0007* (2013.01); *H01H 2071/004* (2013.01); *H02H 1/063* (2013.01)

(58) Field of Classification Search
   USPC ......................................................... 361/45
   See application file for complete search history.

(56)          References Cited

OTHER PUBLICATIONS

European Patent Office, "International Search Report and Written Opinion", PCT/US2014/064784, dated Jul. 10, 2015, 12 pp.

\* cited by examiner

CIRCUIT INTERRUPTER AND SYSTEM FOR TESTING THE SAME

BACKGROUND

Field

The disclosed concept relates generally to circuit interrupters, and in particular, to circuit interrupters including a test module.

Background Information

Electrical switching apparatus include, for example, circuit switching devices; circuit interrupters, such as circuit breakers; network protectors; contactors; motor starters; motor controllers; and other load controllers. Electrical switching apparatus such as circuit interrupters and, in particular, circuit breakers, are well known in the art.

Circuit interrupters, such as for example and without limitation, circuit breakers, are used to protect electrical circuitry from damage due to an overcurrent condition, such as an overload condition, a short circuit, or another fault condition, such as an arc fault or a ground fault. Molded case circuit breakers typically include a pair of separable contacts per phase. The separable contacts may be operated either manually by way of a handle disposed on the outside of the case or automatically in response to a detected fault condition. Typically, such circuit breakers include an operating mechanism, which is designed to rapidly open and close the separable contacts, and a trip mechanism, such as a trip unit, which senses a number of fault conditions to trip the breaker automatically. Upon sensing a fault condition, the trip unit trips the operating mechanism to a trip state, which moves the separable contacts to their open position.

It is well known to employ trip units which utilize a microprocessor to detect various types trip conditions and provide various protection functions. In order to detect various trip conditions, the microprocessor receives signals from one or more sensors such as a current sensor.

Circuit interrupters are tested occasionally to determine whether they are operating correctly. One arrangement for testing a circuit interrupter is shown in FIG. 1. The testing arrangement includes a circuit interrupter 1 and an external test device 6. The circuit interrupter 1 includes a sensor 2 such as, without limitation, a current sensor, electrically connected to a signal processing circuit 3. The signal processing circuit 3 is electrically connected to a microprocessor 4, and in particular to an analog to digital converter 5 included in the microprocessor 4.

Under normal operation, the output of the sensor 2 is processed by the signal processing circuit 3 (e.g., amplification or any other suitable signal processing) and is then provided to the microprocessor 4. The microprocessor 4 may then use the signal to determine if there is a trip condition present.

The external test device 6 is a specialized device that is configured to generate a test signal that mimics the output of the sensor 2. The external test device 6 is configured to electrically connect to the signal processing circuit 3. The external test device 6 provides the test signal that mimics the output of the sensor 2 to the signal processing circuit 3, which processes it and provides it to the microprocessor 4. By using test signals to mimic selected sensor 2 conditions, proper operation of the microprocessor 4 can be tested.

Although the test arrangement shown in FIG. 1 allows for testing of the circuit interrupter 1, it is not without drawbacks. In particular, the external test device 6 is a specialized piece of equipment that increases the cost of testing the circuit interrupter 1. It would be desirable to reduce the cost of testing circuit interrupters.

There is room for improvement in circuit interrupters.

There is also room for improvement in systems to test circuit interrupters.

SUMMARY

These needs and others are met by embodiments of the disclosed concept in which a circuit interrupt includes a waveform generator structured to generate a waveform that mimics a sensor signal.

In accordance with one aspect of the disclosed concept, a circuit interrupter includes a sensor structured to output a sensor signal; a control unit structured to receive an external control signal, the control unit including: a communication interface structured to receive the external control signal, and a waveform generator structured to generate a waveform equivalent to the sensor signal in response to the external control signal: and a signal processing circuit structured to receive and process the sensor signal or the generated waveform and to output the processed sensor signal or generated waveform to the control unit.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
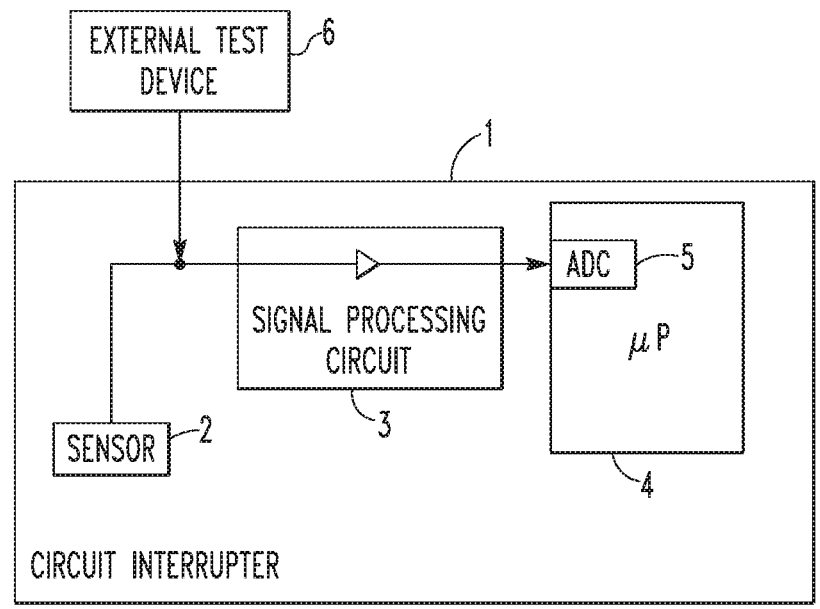
FIG. 1 is a schematic diagram of a test arrangement for a circuit interrupter.

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

As employed herein, the term "processor" shall mean a programmable analog and/or digital device that can store, retrieve, and process data; a microprocessor; a microcontroller, a microcomputer; a central processing unit; or any suitable processing device or apparatus.

Figure 2:
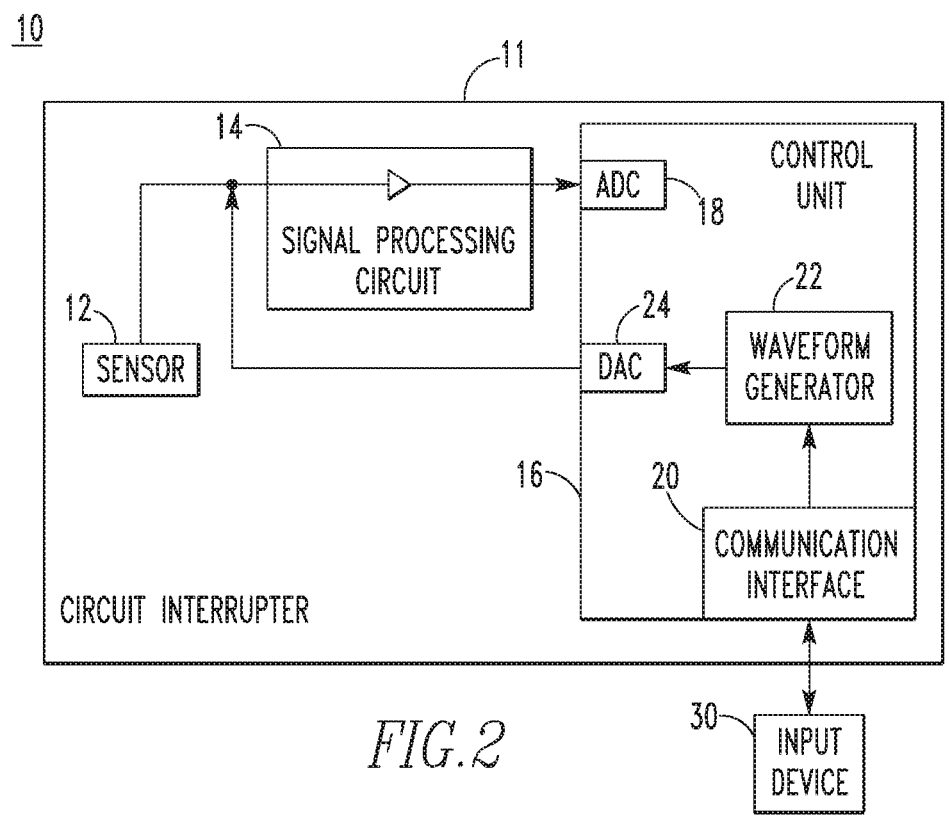
FIG. 2 is a schematic diagram of a test arrangement for a circuit interrupter in accordance with an example embodiment of the disclosed concept.

A system 10 for testing a circuit interrupter 11 in accordance with an example embodiment of the disclosed concept is shown in FIG. 2. The system 10 includes the circuit interrupter 11 and an input device 30.

The circuit interrupter 11 includes a sensor 12, a signal processing circuit 14 and a control unit 16. The sensor 12 may be any type of sensor 12 employed on the circuit interrupter 11. Some examples of types of sensors are current sensors, temperature sensors, and voltage sensors. The sensor 12 is electrically connected to the signal processing circuit 14 and is configured to output a sensor signal to the signal processing circuit 14. The signal processing circuit 14 processes the sensor and outputs it to the control unit 16 and, for example, to an analog-to-digital converter 18 included in the control unit 16. The signal processing circuit 14 may perform any suitable type of processing to the sensor signal. For example and without limitation, the signal processing circuit 14 may amplify or level-shift the sensor signal before providing it to the control unit 16. It is contemplated that in some example embodiments of the disclosed concept, the signal processing circuit 14 may be omitted and the sensor signal is provided directly to the microprocessor 16.

The control unit 16 is structured to receive signals from the sensor 12 and/or other sensors included in the circuit interrupter to determine if any trip conditions exist. The control unit 16 may be embodied, without limitation on a processor or a processor including associated circuitry and components such as a memory.

The control unit 16 includes a communication interface 20. The communication interface 20 is structured to communicate with the input device 30. The communication interface 20 facilitates communication with the input device 30 using a suitable protocol such as, for example and without limitation, universal serial bus (USB), Bluetooth, wireless local area network (WLAN), ethernet, near field communication (NFC), etc.

The input device 30 is an electronic device suitable to communicate with the control unit 16 via the communication interface 20. It is contemplated that the input device 30 is a common type of electronic device such as, without limitation, a mobile device such as a phone, tablet, or laptop computer, or another type of computing device such as a personal computer. Through input device 30, a user may initiate a test of the circuit interrupter 11. For example and without limitation, a control signal output by the input device 30 and received at the communication interface 20, may initiate a test of the circuit interrupter 11. It is contemplated that the input device 30 need not be directly electrically connected to the control unit 16, but may communicate with the control unit 16 via any number of intermediate devices.

The control unit 16 further includes a waveform generator 22. The waveform generator 22 is structured to generate one or more waveforms that are equivalent to the sensor signal. The waveform generated by the waveform generator 22 does not need to be identical to the sensor signal. However, as used herein, the term "equivalent" shall mean that the waveform generated by the waveform generator 22 will be interpreted by the control unit 16 as though it were the sensor signal. For example, if the sensor signal is a sine wave and the control unit 16 interprets the sine wave by taking its root mean square value, the waveform generated by the waveform generator 22 may also be a sine wave, or it may be another waveform, such as a square wave, having the same root mean square value as the sensor signal.

In some embodiments of the disclosed concept, the waveform generator 22 includes an associated memory (not shown) in which one or more waveforms are stored. Generation of a waveform may be initiated in response to the circuit interrupter receiving the control signal from the input device 30. The waveform generator 22 outputs generated waveforms to a digital-to-analog converter 24.

The digital-to-analog converter 24 converts a digital generated waveform to its corresponding analog generated waveform. In the example embodiment of the disclosed concept shown in FIG. 2, the digital-to-analog converter 24 is included in the control unit 16. However, the disclosed concept is not limited thereto. It is also contemplated that the digital-to-analog converter 24 may be separate from the control unit 16. It is also contemplated that the digital-to-analog converter 24 may be included in the waveform generator 22 such that the waveform generator 22 outputs an analog generated waveform. The digital-to-analog converter 24 outputs the analog generated waveform to the signal processing circuit 14. In some example embodiments of the disclosed concept, the signal processing circuit 14 is omitted and the digital-to-analog converter 24 outputs the analog generated waveform to the analog-to-digital converter 18.

It is contemplated that waveform generation may be done by any device or output suitable to simulate the sensor signal. For example and without limitation, a pulse width modulator output or a simple digital output of a microprocessor may be employed for waveform generation.

The signal processing circuit 14 processes (e.g., without limitation, amplification or level shifting) the analog generated waveform and outputs it to the control unit 16 and, for example, to the analog-to-digital converter 18 included in the control unit 16. The analog-to-digital converter 18 converts the analog generated waveform to its corresponding digital generated waveform. It is also contemplated that a conditioning circuit may be employed between the signal processing circuit 14 and the control 16 unit to provide further conditioning of the sensor signal or the analog generated waveform.

As discussed previously, the control unit 16 is structured to receive signals from the sensor 12 and/or other sensors included in the circuit interrupter to determine if any trip conditions exist. The waveform generator 22 can generate waveforms which mimic the output of the sensor 12 during a trip condition (e.g., without limitation, an over-current condition; and over-temperature condition: etc.), which can test whether the circuit interrupter 11 is operating properly (e.g., without limitation, trips in response to a trip condition).

The system 10 of FIG. 2 allows the circuit interrupter 11 to be tested without a specialized external test device 6 (see FIG. 1). In particular, since the input device 30 does not need to generate the waveform that mimics the output of the sensor 12, the input device 30 may be a common electronic device, which is more readily and cheaply available than a specialized external test device 6. As such, the system 10 of FIG. 2 allows improved testing of the circuit interrupter 11.

Figure 3:
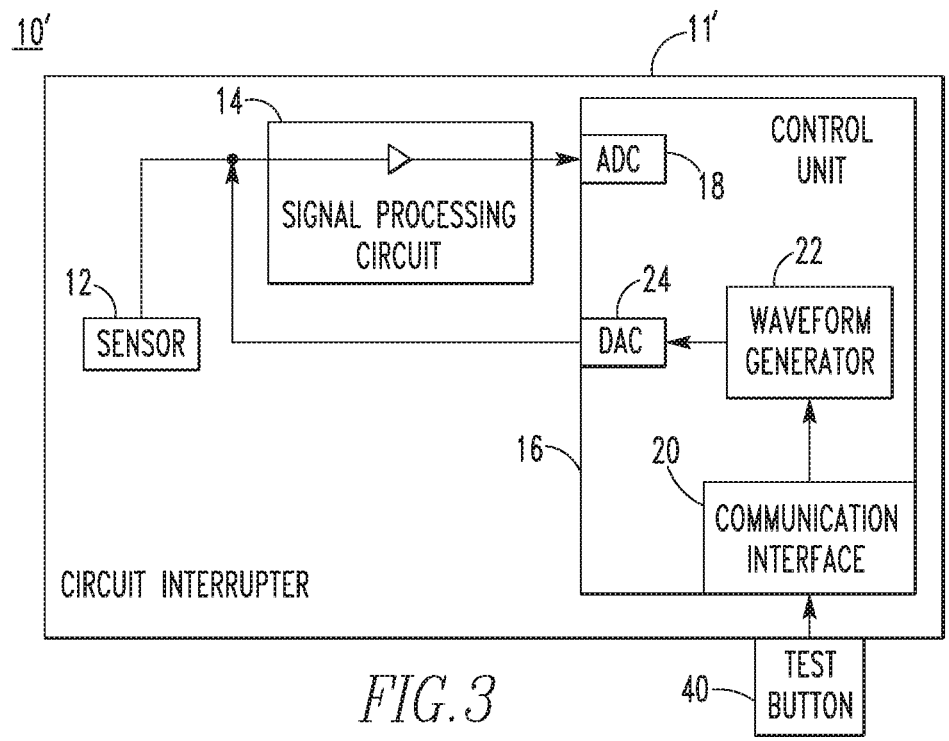
FIG. 3 is a schematic diagram of a test arrangement for a circuit interrupter in accordance with another example embodiment of the disclosed concept.

A system 10' for testing a circuit interrupter 11' in accordance with another example embodiment of the disclosed concept is shown in FIG. 3. The system 10' of FIG. 3 is similar to the system 10 of FIG. 2. However, in the system 11' of FIG. 3, the circuit interrupter 11' includes a test button 40 disposed on its exterior.

The test button 40 may be actuated by a user to initiate a test of the circuit interrupter 11'. In more detail, the test button 40 is electrically connected to the communication interface 20 and the communication interface 20 receives a signal when the test button 40 is actuated. In response to receiving the signal, the communication interface 20 causes the waveform generator 22 to generate one or more predetermined waveforms.

The test button 40 is a simple device which is less expensive that the specialized test device 6 (see FIG. 1) or the input device 30 (see FIG. 2). Thus, the system 10' allows for testing of the circuit interrupter 11' inexpensively. It is contemplated that the system 10 of FIG. 2 may be modified to include the test button 40 without departing from the scope of the disclosed concept.

Figure 4:
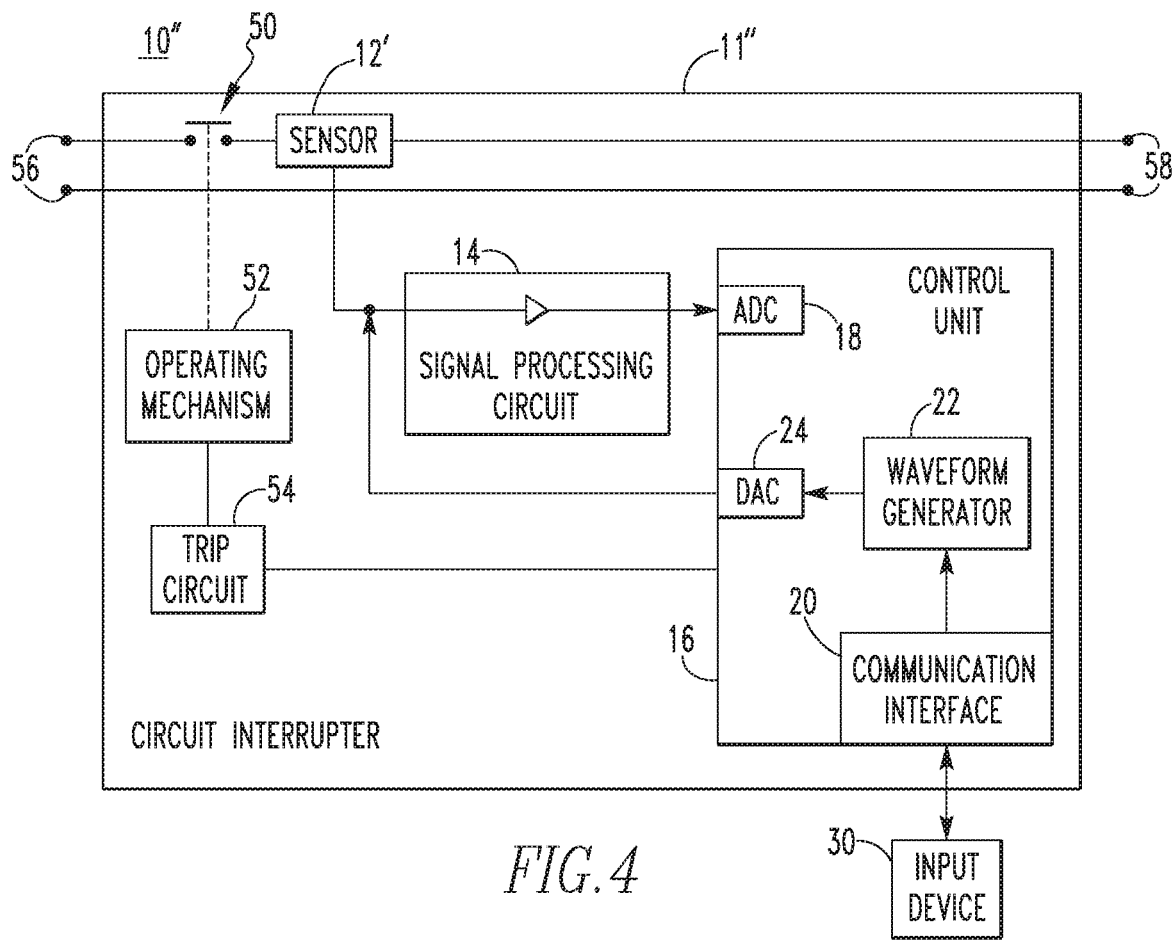
FIG. 4 is a schematic diagram of a test arrangement for a circuit interrupter in accordance with another example embodiment of the disclosed concept.

FIG. 4 is a schematic diagram of a system 10" for testing a circuit interrupter 11" in accordance with another example embodiment of the disclosed concept. The system 10" of FIG. 4 is similar to the system 10 of FIG. 2. However, the circuit interrupter 11" of FIG. 4 is shown in more detail and includes separable contacts 50, an operating mechanism 52, and a trip circuit 54. The circuit interrupter 11" also includes line terminals 56 and load terminals 58 structured to electrically connect to a protected circuit.

The separable contacts 50 are disposed between one of the line terminals 56 and one the load terminals 58. The separable contacts 50 are structured to open to interrupt current flowing between the line and load terminals 56,58. The operating mechanism 52 is a device structured to trip open the separable contacts 50, and the trip circuit 54 is structured to output a signal to cause the operating mechanism 52 to trip open the separable contacts 50. The control unit 16 is electrically connected to the trip circuit 54 and control the trip circuit 54 to output the signal to cause the operating mechanism 52 to trip open the separable contacts 50.

The circuit interrupter 11" includes a sensor 12' disposed between one of the line terminals 56 and one of the load terminals 58. The sensor 12' is a current sensor and senses the current flowing between the line and load terminals 56,58. When the control unit 16 detects a fault condition based on the output of the sensor 12' (e.g., without limitation, an overcurrent condition), the control unit 16 controls the trip circuit 54 to output a signal to cause the operating mechanism 52 to trip open the separable contacts 50.

The waveform generator 22 is structured to generate waveforms that mimic the output of the sensor 12' in order to test the circuit interrupter 11". For example, the waveform generator 22 may generate an output of the sensor 12' corresponding to a fault condition. If the circuit interrupter 11" is working properly, the operating mechanism 52 should trip open the separable contacts 50 in response to such a waveform.

Figure 5A:
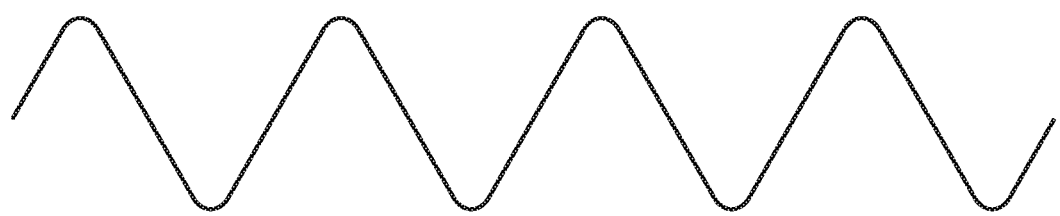
FIGS. 5A-5C are plots of example waveforms that mimic sensor output in accordance with an example embodiment of the disclosed concept.
Figure 5B:
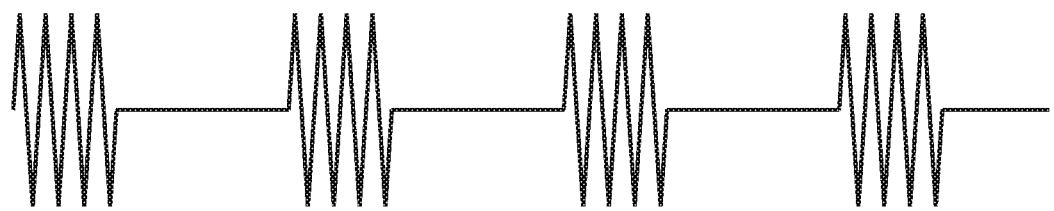
Figure 5C:
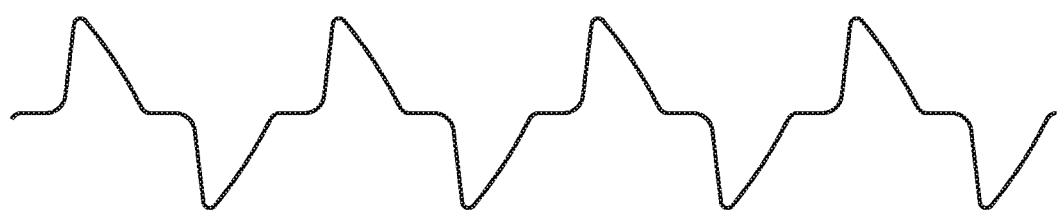

FIGS. 5A-5C are plots of example waveforms that may be generated by the waveform generator 22. FIG. 5A is an example of a standard sinusoidal signal. FIG. 5B is an example of a high frequency pulsed signal. FIG. 5C is an example of a phase controlled signal. It is contemplated that the waveform generator 22 may manipulate the waveforms shown in FIGS. 5A-5C in any manner suitable to mimic the output of a sensor. It will be appreciated that the waveform generator 22 is not limited to generating the base waveforms shown in FIGS. 5A-5C, but rather the waveform generator 22 may generate any waveform that mimics the output of a sensor.

It is contemplated that the waveform generator 22 may generate an analog or digital waveform without departing from the disclosed concept. It is also contemplated that generated waveform may be in analog or digital form at any point from when it is generated by the waveform generator 22 to when it is again received and processed by the control unit 16. For example and without limitation, the generated waveform may be generated as a digital waveform and remain as a digital waveform, it may be generated as an analog waveform and remain as an analog waveform, or it may be converted between digital and analog forms at any point without departing from the scope of the disclosed concept.

Figure 6:
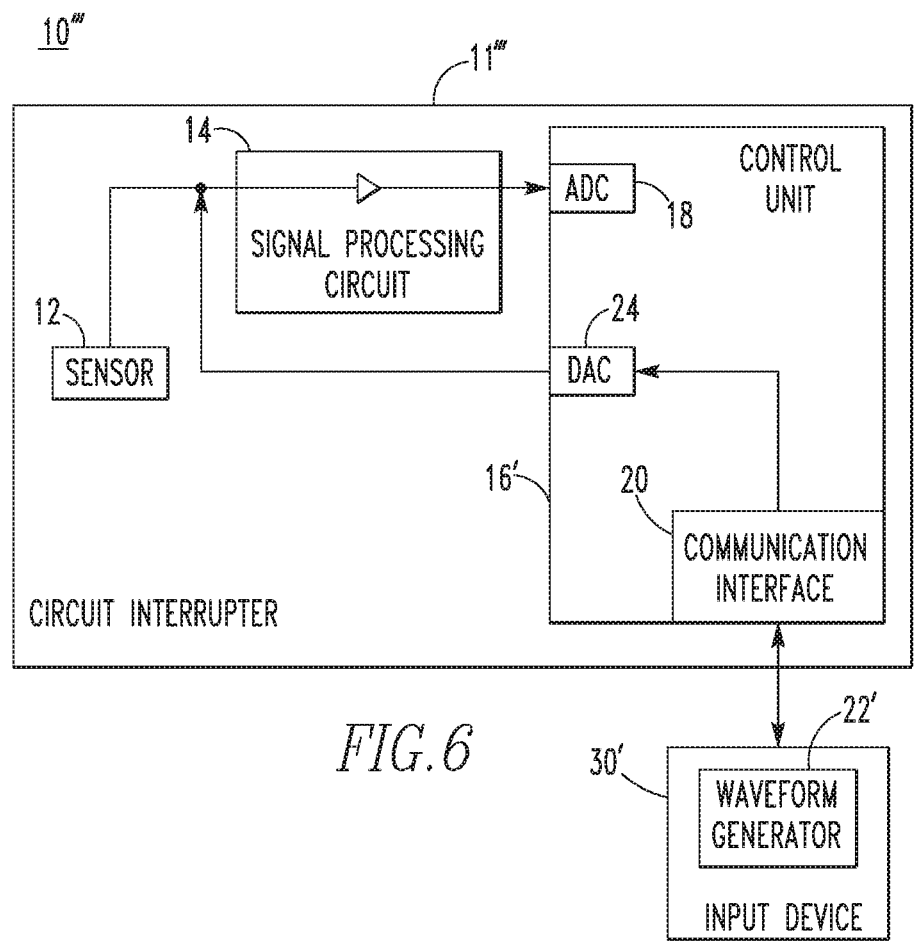
FIG. 6 is a schematic diagram of a system for testing a circuit interrupter in accordance with another example embodiment of the disclosed concept.

FIG. 6 is a schematic diagram of a system 10''' for testing a circuit interrupter 11''' in accordance with another example embodiment of the disclosed concept. The system 10''' of FIG. 6 is similar to the system 10 of FIG. 2. However, in the system 10''' of FIG. 6, the waveform generator 22' is disposed in the input device 30', rather than in the control unit 16'. The waveform generator 22' is structured to generate an analog waveform equivalent to the sensor signal and the input device communicates the analog waveform to the control unit 16'. The control unit 16' then converts the analog waveform to its corresponding digital, or other suitable, waveform and outputs it to the signal processing circuit 14.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A circuit interrupter comprising:
   a sensor structured to output a sensor signal;
   a control unit embodied on a processor and structured to receive an external control signal, the control unit including:
      a communication interface structured to receive the external control signal, and
      a waveform generator structured to generate a waveform equivalent to the sensor signal in response to the external control signal; and
   a signal processing circuit structured to receive and process the sensor signal or the generated waveform and to output the processed sensor signal or generated waveform to the control unit.

2. The circuit interrupter of claim 1, wherein the communication interface is structured to receive the external control signal from an input device.

3. The circuit interrupter of claim 2, wherein the communication interface and the input device are structured to communicate using at least one of universal serial bus (USB), Bluetooth, wireless local area network (WLAN) protocols, ethernet, and near field communication.

4. The circuit interrupter of claim 2, wherein the input device is at least one of a mobile phone, a tablet, a laptop computer, and a personal computer.

5. The circuit interrupter of claim 1, further comprising:
   a test button disposed on an exterior of the circuit interrupter and structured to generate the external control signal in response to being actuated.

6. The circuit interrupter of claim 1, wherein the generated waveform is a digital generated waveform; and wherein the control unit further includes a digital to analog converter structured to convert the digital generated waveform to a corresponding analog generated waveform.

7. The circuit interrupter of claim 1, wherein the sensor is at least one of a current sensor, a temperature sensor, and a voltage sensor.

8. The circuit interrupter of claim 1, wherein the signal processing circuit performs at least one of amplification and level shifting on the sensor signal or generated waveform.

9. The circuit interrupter of claim 1, further comprising:
line and load terminals;
separable contacts disposed between one of the line terminals and one of the load terminals, the separable contacts being structured to open to interrupt current flowing between the line and load terminals;
an operating mechanism structured to cause the separable contacts to trip open; and
a trip circuit structured to output a signal to control the operating mechanism to cause the separable contacts to trip open.

10. The circuit interrupter of claim 9, wherein the control unit is structured to control the trip circuit based on the sensor signal or the generated waveform.

11. The circuit interrupter of claim 9, wherein the sensor is disposed between one of the line terminals and one of the load terminals and is structured to sense a current flowing between the line and load terminals.

12. The circuit interrupter of claim 1, wherein the generated waveform is based on at least one of a standard sinusoidal signal, a high frequency pulsed signal, and a phase controlled signal.

13. A system for testing a circuit interrupter, the system comprising:
an input device; and
a circuit interrupter comprising:
a sensor structured to output a sensor signal;
a control unit embodied on a processor and structured to receive an external control signal, the control unit including:
a communication interface structured to receive the external control signal, and
a waveform generator structured to generate a waveform equivalent to the sensor signal in response to the external control signal; and
a signal processing circuit structured to receive and process the sensor signal or the generated waveform and to output the processed sensor signal or generated waveform to the control unit,
wherein the input device is structured to generate the external control signal.

14. The system of claim 13, wherein the input device is at least one of a mobile phone, a tablet, a laptop computer, and a personal computer.

\* \* \* \* \*